United States Patent
Zhao et al.

(10) Patent No.: US 11,314,125 B2
(45) Date of Patent: Apr. 26, 2022

(54) LED BACKLIGHT MODULE, DISPLAY SCREEN AND DETECTION METHOD OF LED BACKLIGHT MODULE

(71) Applicant: FOSHAN NATIONSTAR OPTOELECTRONICS CO., LTD., Foshan (CN)

(72) Inventors: Qiang Zhao, Foshan (CN); Chuanbiao Liu, Foshan (CN); Kuai Qin, Foshan (CN); Heng Guo, Foshan (CN); Changqi Wang, Foshan (CN); Zongxian Xie, Foshan (CN); Kailiang Fan, Foshan (CN); Chungan Jiang, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 158 days.

(21) Appl. No.: 16/587,279

(22) Filed: Sep. 30, 2019

(65) Prior Publication Data

US 2020/0133069 A1 Apr. 30, 2020

(30) Foreign Application Priority Data

Oct. 26, 2018 (CN) .......................... 201811259697.9

(51) Int. Cl.
| | |
|---|---|
| G02F 1/13357 | (2006.01) |
| H01L 25/075 | (2006.01) |
| H01L 33/50 | (2010.01) |
| H01L 33/62 | (2010.01) |
| H01L 33/64 | (2010.01) |
| H01L 33/60 | (2010.01) |

(Continued)

(52) U.S. Cl.
CPC .... *G02F 1/133603* (2013.01); *H01L 25/0753* (2013.01); *H01L 33/502* (2013.01); *H01L 33/60* (2013.01); *H01L 33/62* (2013.01); *H01L 33/647* (2013.01); *H05B 45/10* (2020.01); *G02F 1/133612* (2021.01)

(58) Field of Classification Search
CPC ......... G02F 1/133603; G02F 1/133612; H05B 45/10; H01L 25/0753; H01L 33/502; H01L 33/60; H01L 33/62; H01L 33/647
USPC ....................................................... 362/97.1
See application file for complete search history.

(56) References Cited

U.S. PATENT DOCUMENTS

| | | | |
|---|---|---|---|
| 2008/0117637 A1* | 5/2008 | Chang ................. | F21V 29/51 362/294 |
| 2012/0098458 A1* | 4/2012 | Dai ..................... | H05B 45/395 315/294 |
| 2012/0139868 A1* | 6/2012 | Mamba ................ | G06F 3/0418 345/174 |

* cited by examiner

*Primary Examiner* — Rajarshi Chakraborty
*Assistant Examiner* — Hana S Featherly
(74) *Attorney, Agent, or Firm* — Bond Schoeneck & King, PLLC; George McGuire

(57) ABSTRACT

Provided is a LED backlight module, display screen and detection method of a LED backlight module. The LED backlight module includes a substrate and multiple LED chips arranged on the substrate, one first detection group is arranged on the substrate for each LED chip of more than one LED chip arranged at an interval of N LED chips connected in series, where N is greater than or equal to 0, the first detection group includes a first positive electrode detection point and a first negative electrode detection point, the first positive electrode detection point and the first negative electrode detection point of the first detection group are respectively connected to a positive electrode and a negative electrode of the each LED chip.

18 Claims, 4 Drawing Sheets

(51) Int. Cl.
*H05B 45/10* (2020.01)
*G02F 1/1335* (2006.01)

LED BACKLIGHT MODULE, DISPLAY SCREEN AND DETECTION METHOD OF LED BACKLIGHT MODULE

CROSS-REFERENCE TO RELATED APPLICATIONS

This application claims priority to Chinese patent application No. 201811259697.9 filed with the Patent Office of the People's Republic of China on Oct. 26, 2018, the disclosure of which is incorporated herein by reference in its entirety.

TECHNICAL FIELD

The disclosure relates to the field of display technology and, in particular, to a LED backlight module, display screen including the LED backlight module and detection method of a LED backlight module.

BACKGROUND

The backlight module of a liquid crystal display television has been developed from an early cold cathode fluorescent lamp (CCFL) to a present direct type LED backlight module or an edge type LED backlight module, with increasing requirements on display effect of a liquid crystal display (LCD). Furthermore, with the development of dynamic local dimming technology, energy consumption of a LED backlight module becomes lower and lower. If partitions corresponding to a LED backlight module becomes less, a brightness contrast will get higher, so as to achieve a high dynamic range (HDR).

Dynamic local dimming technology is mostly used in the direct type LED backlight module. The LED backlight module is divided into partitions, which allows independent circuit control of the respective partitions. At present, a traditional packaging method of the direct type LED backlight module is to mount backlight beads on a backlight printed circuit board (PCB) first, then lenses are sequentially mounted, and a light bar (LED backlight strip), a diffuser plate and so on are mounted side-by-side, so that evenly mixed white light is obtained. This packaging method has many working procedures and complicated processes. The thickness of the backlight module is limited by a superposition of factors, such as the thickness of devices, the height of a lens, the thickness of the PCB and so on, which results in a thick LCD with the direct type backlight module.

With development of science and technology, a mini LED backlight module has been designed. Since the mini LED backlight module may have chips directly packaged on a PCB, a thickness of the whole backlight module may become thinner (the optical distance (OD) is less than 5 mm); moreover, the small chip size of the mini LED (generally the chip has a width about 100 μm) allows to achieve more partitions, and even point-to-point lighting control. So that finer division and a higher brightness contrast are realized, which may present a HDR effect comparable to an organic light emitting diode (OLED), and corresponding energy consumption is greatly reduced due to an implementation of finer local dimming.

However, a current mini LED backlight module is still not satisfactory for following reasons: 1. since a front surface of the mini LED chip has high brightness, in order to realize a smaller optical distance, a denser arrangement of chips is needed, so the number of chips increases, manufacturing cost increases, and yield rate of products is reduced; 2. in a case of a large number of partitions, more series and parallel circuits are needed, so the insufficiently fine division of these chips may easily lead to uneven brightness among partitions, and even uneven brightness in a single partition in severe cases; and 3. if a small partition has a defective point before or after packaging, detection and repair are also relatively difficult.

SUMMARY

Embodiments of the present disclosure provide a LED backlight module, display screen and detection method of a LED backlight module.

In a first aspect, a LED backlight module is provided, the LED backlight module includes a substrate and multiple LED chips arranged on the substrate, one first detection group is arranged on the substrate for each LED chip of more than one LED chip arranged at an interval of N LED chips connected in series, where N is greater than or equal to 0, the first detection group includes a first positive electrode detection point and a first negative electrode detection point, the first positive electrode detection point and the first negative electrode detection point of the first detection group are respectively connected to a positive electrode and a negative electrode of the each LED chip.

Through arrangement of detection points at the each LED chip or at each chip with an interval of more than one LED chip, lighting detection of the each LED chip or each group of LED chips connected in series can be performed before the multiple LED chips are packaged, thus detection accuracy can be greatly improved, and further yield rate of products can be greatly increased.

In an embodiment of the present disclosure, multiple partitions are arranged on the substrate, and each partition of the multiple partitions is provided with at least two LED chips connected in series or parallel, the LED backlight module further includes a second detection group capable of independently detecting the each partition, the second detection group includes a second positive electrode detection point and a second negative electrode detection point, the second positive electrode detection point and the second negative electrode detection point of the second detection group are respectively connected to a positive electrode and a negative electrode of the each partition.

In an embodiment of the present disclosure, a number of the multiple partitions is M, and a sum of a number of second positive electrode detection points and a number of second negative electrode detection points is at least M+1.

In an embodiment of the present disclosure, the substrate has a first surface, the multiple LED chips and the first detection group are arranged on the first surface.

In an embodiment of the present disclosure, the substrate has a first surface and a second surface opposite to the first surface, the multiple LED chips are arranged on the first surface, the first detection group is arranged on the second surface, a through via is formed through the substrate, a conductive element is disposed in the through via, each conductive element is connected to one of the first detection group or the each LED chip.

In an embodiment of the present disclosure, a positive electrode bonding pad, a negative electrode bonding pad, a conductive wire for connecting the positive electrode bonding pad to another negative electrode bonding pad adjacent to the positive electrode bonding pad and a conductive wire for connecting the negative electrode bonding pad to another positive electrode bonding pad adjacent to the negative electrode bonding pad are arranged on the substrate corresponding to the each LED chip, the first positive electrode detection point is arranged on a conductive wire connected to the positive electrode bonding pad of the each LED chip, and the first negative electrode detection point is connected to a conductive wire connected to the negative electrode bonding pad of the each LED chip.

In an embodiment of the present disclosure, the substrate has a first surface, the multiple LED chips are arranged on the first surface, the first surface is coated with an insulating reflective layer, and the reflective layer is provided with a hollowed-out partition for exposing the first positive electrode detection point, the first negative electrode detection point and multiple bonding pads of the multiple LED chips.

In an embodiment of the present disclosure, the reflective layer is a white ink layer with high temperature resistance, the white ink layer has light reflectance greater than 80%.

In an embodiment of the present disclosure, a first protective layer is disposed on the first positive detection point and the first negative detection point; and/or, a second protective layer is disposed on the multiple bonding pads.

In an embodiment of the present disclosure, the first protective layer and the second protective layer are made of a same material.

In an embodiment of the present disclosure, each of the first protective layer and the second protective layer is an OSP film or a metal plating layer.

In an embodiment of the present disclosure, each of the multiple LED chips has a beam angle greater than 120°.

In an embodiment of the present disclosure, the multiple LED chips have a wavelength span equal to or less than 2.5 nm; and/or
the multiple LED chips have a voltage drop span equal to or less than 0.1 V; and/or
the multiple LED chips have an optical power span equal to or less than 0.2 mW.

In an embodiment of the present disclosure, the multiple LED chips are packaged on the substrate by a packaging colloid.

In an embodiment of the present disclosure, a groove is formed on a surface of the packaging colloid, where the groove is unconnected to a cavity of the packaging colloid for packaging the multiple LED chips.

In an embodiment of the present disclosure, the packaging colloid is one of a transparent packaging colloid, a YAG fluorescent powder colloid, KSF fluoride fluorescent powder or a quantum dot protective film.

In an embodiment of the present disclosure, the substrate has a first surface and a second surface opposite to the first surface, the multiple LED chips are arranged on the first surface, a heat dissipation layer is disposed on the second surface.

In an embodiment of the present disclosure, the heat dissipation layer is a heat dissipation copper layer in a form of mesh spots.

In a second aspect, a screen display is provided, the screen display includes the LED backlight module.

In a third aspect, a detection method of a LED backlight module is provided, the method includes steps described below.

A detection tool is connected to at least one second detection group on the LED backlight module to light up all LED chips in a designated partition of the LED backlight module, a brightness value of the designated partition is determined with all LED chips light up, the brightness value of the designated partition is compared with a preset brightness value, and all LED chips in the designated partition are determined to be qualified when the brightness value is greater than the preset brightness value, or existence of an unqualified LED chip in the designated partition is determined when the brightness value is less than or equal to the preset brightness value;

if the existence of the unqualified LED chip in the designated partition, the detection tool is connected to a first detection group in the designated partition to light up all LED chips in the designated partition one by one, and a position of the unqualified LED chip is determined.

In an embodiment of the present disclosure, the detection tool lights up all partitions on the LED backlight module one by one or at the same time.

BRIEF DESCRIPTION OF DRAWINGS

In order to more clearly explain the embodiments of the present disclosure or related technologies, brief introduction of drawings needed in the description of the embodiments or related technologies will be as follows. Obviously, the drawings in the following description are only simplified schematic diagrams of some embodiments of the present disclosure or related technologies. For those skilled in the art, other drawings may be obtained according to these drawings without creative work.

In those figures.

1. Substrate; 11. Heat dissipation layer; 12. Insulating layer; 13. Conductive wire; 2. First positive electrode detection point; 3. First negative electrode detection point; 4. Positive electrode bonding pad; 5. Negative electrode bonding pad; 6. White ink layer; 7. Packaging colloid; 71. Groove; 8. LED chip.

DETAILED DESCRIPTION

Hereinafter, the embodiments of the present disclosure will be clearly and completely described with reference to the drawings in the embodiments of the present disclosure. Obviously, the described embodiments are only a part of embodiments of the present disclosure, not all embodiments. Based on the embodiments of the present disclosure, all other embodiments obtained by those of ordinary skill in the art without creative work are within the protection scope of the present disclosure.

In the description of the embodiments of the present disclosure, terms of "connected to", "connected with" and "fixed" should be understood broadly unless otherwise specified and defined, for example, it may refer to fixed connection, removable connection, or integration, and it may be a mechanical connection or an electrical connection, or may be direct connection or indirect connection through an intermediate medium, or may be internal communication of two elements or an interaction relationship of two elements. For those of ordinary skill in the art, specific meaning of the above terms in the embodiments of the present disclosure may be understood in specific situations.

In the embodiments of the present disclosure, unless otherwise explicitly specified and defined, "upper" or "lower" of a first feature over a second feature may include direct contact of the first and second features, or may include contact of the first and second features not directly but through an additional feature between them. Moreover, the first feature "above", "upon" and "on top of" the second feature include the first feature directly above and obliquely above the second feature, or simply indicate that the first feature has a higher horizontal height than the second feature. The first feature "below", "under" and "lower than" the second feature include the first feature directly below and obliquely below the second feature, or simply indicate that the first feature has a lower horizontal height than the second feature.

Figure 1:
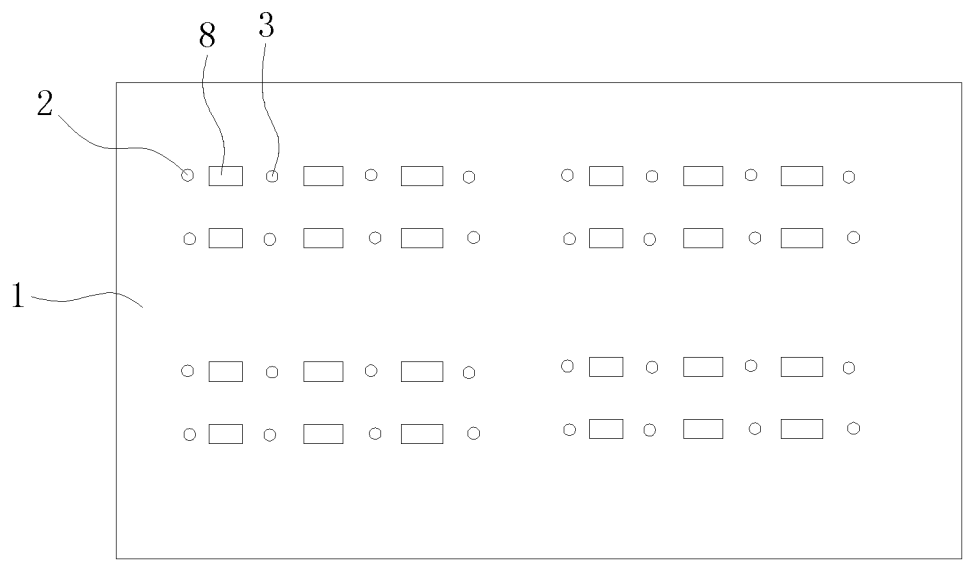
FIG. 1 is a schematic top view of a LED backlight module according to an embodiment of the present disclosure (a first positive electrode detection point and a first negative electrode detection point are located on a front surface of a substrate).
Figure 2:
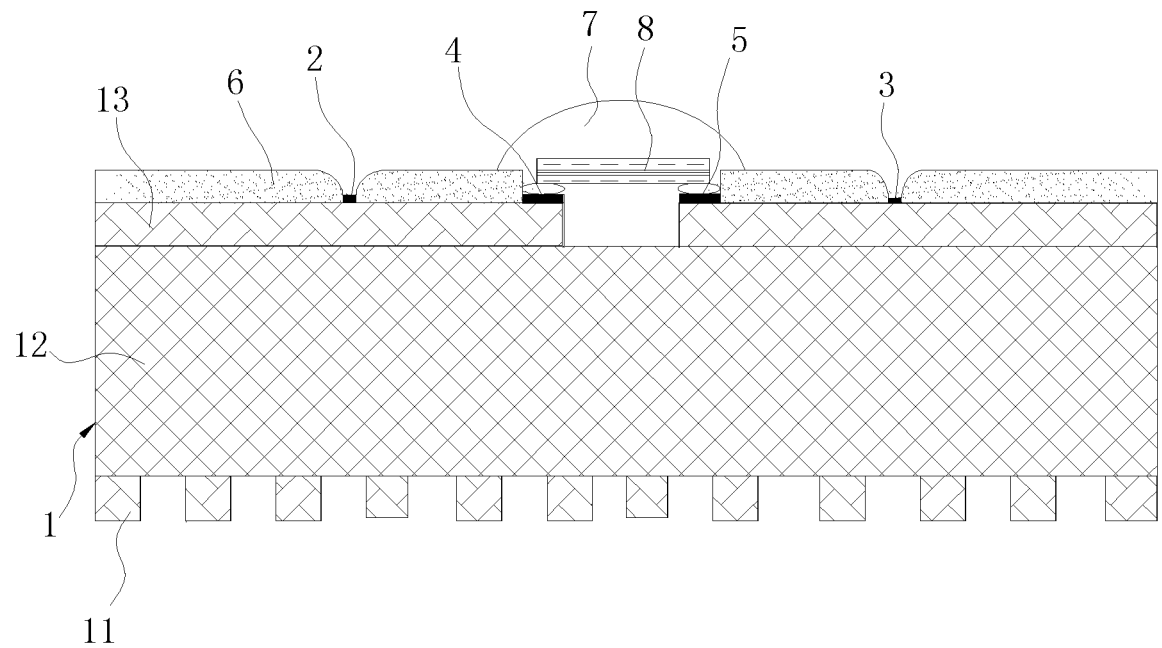
FIG. 2 is a partial cross-sectional view of FIG. 1.

FIG. 1 is a schematic top view of a LED backlight module according to an embodiment of the present disclosure (a first positive electrode detection point 2 and a first negative electrode detection point 3 are located on a front surface of a substrate 1); FIG. 2 is a partial cross-sectional view of a LED backlight module according to an embodiment of the present disclosure (the first positive electrode detection point 2 and the first negative electrode detection point 3 are located on the front surface of the substrate 1). Referring to FIG. 1 and FIG. 2, the embodiments of the present disclosure provide a LED backlight module, the LED backlight module includes a substrate 1 and multiple LED chips 8 arranged on the substrate 1, one first detection group is arranged on the substrate 1 for each LED chip 8 of more than one LED chip 8 arranged at an interval of N LED chips 8 connected in series, where N is greater than or equal to 0, the first detection group includes a first positive electrode detection point 2 and a first negative electrode detection point 3, the first positive electrode detection point 2 and the first negative electrode detection point 3 are respectively connected to a positive electrode and a negative electrode of the each LED chip 8. Through arrangement of detection points at the each LED chip 8 or at each LED chip 8 with an interval of more than one LED chip 8, lighting detection of the each LED chip 8 or each group of LED chips 8 connected in series can be performed before the multiple LED chips 8 are packaged, thus detection accuracy can be greatly improved, and further yield rate of products can be greatly increased.

Specifically, the substrate 1 includes an insulating layer 12 and a conductive wire 13 arranged on the insulating layer 12 for connecting the multiple LED chips 8.

The substrate 1 may be made of a material with high thermal conductivity, low expansion and high temperature resistance, such as a white bismaleimide triazine (BT) material, a FR or an aluminum substrate.

FR4 is an epoxy glass cloth laminate, which is a kind of substrate with epoxy resin as an adhesive and electronic grade glass fiber cloth as a reinforcing material. An adhesive sheet and a copper clad laminate with thin inner core of the FR4 are important base materials for manufacturing a multilayer printed circuit board. Main technical characteristics of the FR4 include stable electrical insulation performance, good flatness, smooth surface, no pits, standard thickness tolerance, low absorbance, and suitable for products with high performance requirements of electronic insulation. The BT material is a kind of white core material with absorptivity being lower than that of a FR4 yellow core material. The absorptivity of FR4 is usually 2% to 5% higher than that of the BT material. So the BT material has a very good reflection effect.

The aluminum substrate is a metal-based copper clad laminate with a good heat dissipation function. Generally, a single panel consists of three layers, i.e., a circuit layer (a copper foil), an insulating layer and a metal base layer. A double-sided board is further designed for a high-end product, which has a structure including a circuit layer, an insulating layer, an aluminum base, an insulating layer and a circuit layer. The aluminum substrate has good thermal conductivity, electrical insulation performance and mechanical processing performance. Compared with the traditional FR4 with a same thickness and line width, the aluminum substrate may carry a higher current, the aluminum substrate has a withstand voltage of 4500V and a thermal conductivity coefficient greater than 1.0.

Specifically, the substrate 1 has a first surface welded with the multiple LED chips 8, and a second surface opposite to the first surface. That is, the first surface is a front surface of the substrate 1, and the second surface is a back surface of the substrate 1. More than one LED chip 8 is arranged on the first surface at equal intervals, and a group of bonding pads, including a positive electrode bonding pad 4 and a negative electrode bonding pad 5, is respectively arranged on the substrate 1 corresponding to the each LED chip 8. The positive electrode bonding pad 4 is connected to a positive electrode of the each LED chip 8, the negative electrode bonding pad 5 is connected to a negative electrode of the each LED chip 8, and the positive electrode bonding pad 4 is connected with the negative electrode bonding pad 5 adjacent to the positive electrode bonding pad 4 through a conductive wire 13.

Furthermore, as shown in FIGS. 1 to 8, an insulating layer 12 of the substrate 1 is provided with conductive wires 13. The conductive wires 13 are copper wires. The first positive electrode detection point 2 is arranged on a conductive wire 13 and connected to the positive electrode bonding pad 4, and the first negative electrode detection point 3 is arranged on a conductive wire 13 and connected to the negative electrode bonding pad 5. That is, the first detection group is disposed on the front surface of the substrate 1. Through this design the multiple LED chips 8 can be detected from the front surface of the substrate 1, which is convenient to observe a lighting situation of the multiple LED chips 8.

Figure 3:
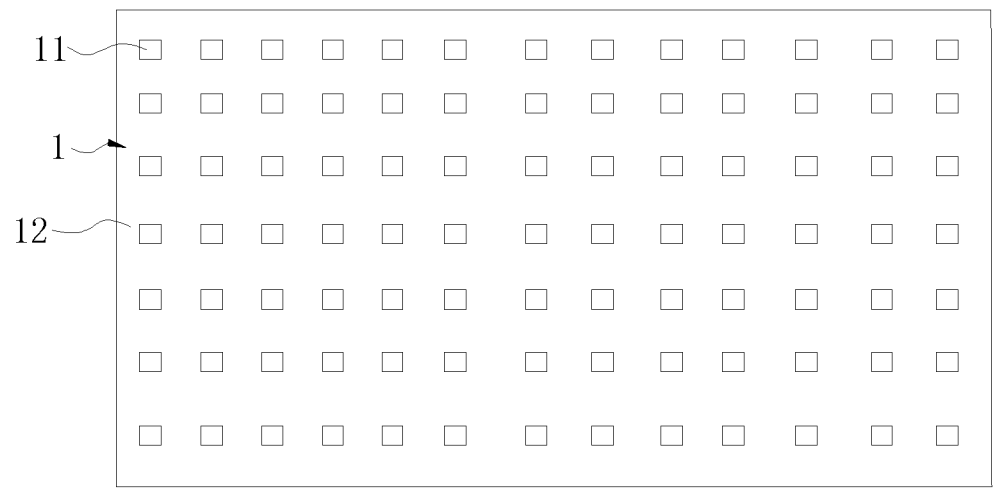
FIG. 3 is a bottom view of FIG. 1.
Figure 4:
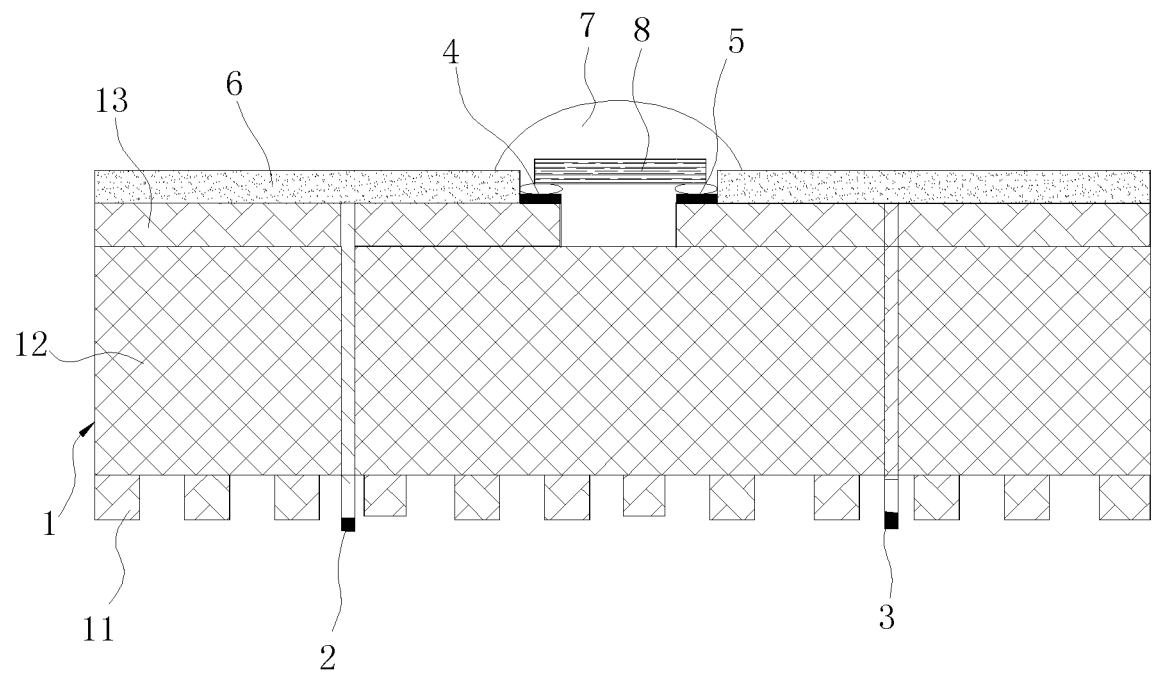
FIG. 4 is a schematic cross-sectional view of a LED backlight module according to an embodiment of the present disclosure (a first positive electrode detection point and a first negative electrode detection point are located on a back surface of a substrate).
Figure 5:
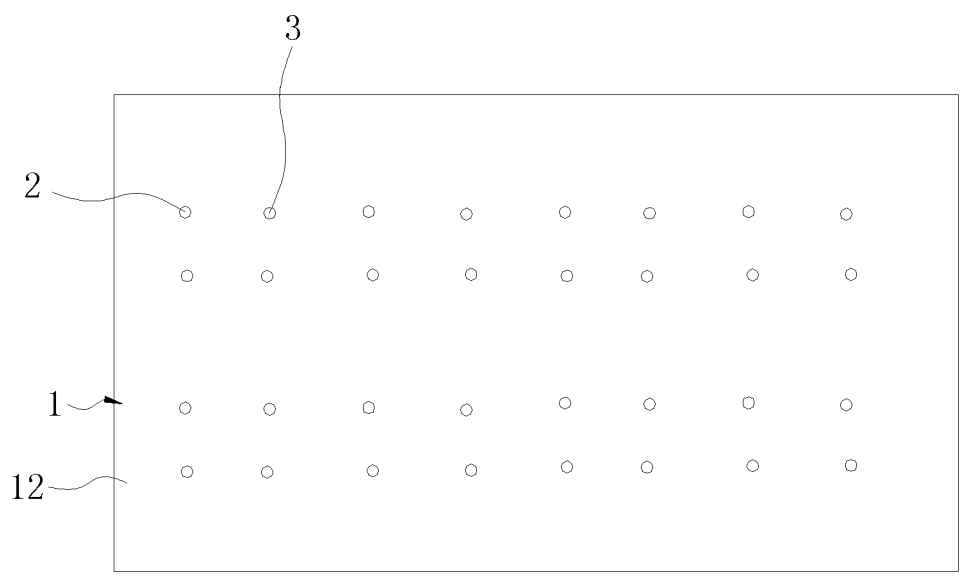
FIG. 5 is a bottom view of FIG. 4 (a heat dissipation layer is not shown).

Of course, the first detection group is not limited to be arranged on the front surface of the substrate 1, which may further be arranged on the back surface of the substrate 1. Specifically, as shown in FIG. 3 and FIG. 4, the first detection group is arranged at a position corresponding to one of the multiple LED chips 8 on the second surface. The first positive electrode detection point 2 and the first negative electrode detection point 3 of the first detection group are arranged with an interval. A through via is formed on the substrate 1 respectively corresponding to the first positive electrode detection point 2 and the first negative electrode detection point 3. The through via is formed through the substrate 1, and a conductive element is disposed in the through via. The conductive element is respectively connected to both the first detection group and a bonding pad corresponding to the LED chips 8. The arrangement of the first detection group on the back surface of the substrate 1 facilitates arrangement of corresponding detection points, and can eliminates influence of the detection points on brightness of the multiple LED chips 8.

In an embodiment, the conductive element is a metal conductive layer disposed in the through via. In a further embodiment, the conductive element is a copper layer disposed in the through via. A plating conductive layer may reduce manufacture and installation difficulty of the conductive element, and thus effectively improve processing efficiency and reduce a defective rate of products.

In an embodiment of the present disclosure, multiple partitions are arranged on the substrate 1, each provided with more than one LED chip 8 connected in series. The LED backlight module further includes a second detection group capable of independently detecting the each partition. The second detection group includes a second positive electrode detection point and a second negative electrode detection point. The second positive electrode detection point and the second negative electrode detection point of the second detection group are respectively connected to a positive electrode of the each partition and a negative electrode of the each partition. Through arrangement of these partitions, detection difficulty and detection amount of the multiple LED chips 8 on the substrate 1 can be reduced.

Specific detection steps are described as follows.

In step S100, A detection tool is used to connect to the second positive electrode detection point and the second negative electrode detection point of the each partition to light up all LED chips in the each partition; prime determination is performed, if brightness of a partition is normal, next partition is detected until all partitions of the whole substrate 1 are detected; if it is determined that brightness of a partition is abnormal, step S200 is performed.

Of course, it is also possible to light up all the partitions at once, and only second positive electrode detection points and second negative electrode detection points on the substrate 1 need to be charged simultaneously during an operation.

In step S200, the partition with a brightness problem is identified.

In step S300, the detection tool is used to connect to the first positive electrode detection point 2 and the first negative electrode detection point 3 of the partition with the brightness problem, and LED chips 8 in this partition are lighted up one by one or multiple continuous LED chips 8 connected in series are lighted for re-detection. If brightness of a LED chip 8 is normal, other LED chips 8 of this partition are continuously detected until all LED chips 8 in the partition are detected; if brightness of a LED chip 8 is abnormal or the LED chip 8 is not lighted up at all, this process proceeds to step S400.

In step S400, the LED chip 8 with a brightness problem is identified.

In step S500, the defective LED chip 8 is overhauled or replaced, and then a new LED chip 8 is detected, after all the LED chips 8 are lighted up, next assembly process is initiated.

Through arrangement of partitions and arrangement of one second detection group at each partition of the multiple partitions, rough screening may be performed on the multiple LED chips 8 on the substrate 1, and then fine screening may be performed on LED chips 8 in the each partition, so as to target on a partition of a defective LED chip 8 quickly. In this way, the detection amount of the multiple LED chips 8 is greatly reduced and detection speed is increased.

An abnormality of partition brightness means that a brightness or voltage drop or wavelength of LED chips 8 corresponding to the number of the multiple LED chips 8 in a corresponding partition does not meet their requirements.

In addition, detection of the multiple LED chips 8 is performed before the multiple LED chips 8 are packaged, which facilitates inspection and replacement of the LED chips 8.

In an embodiment, the number of partitions is M, and a sum of the number of second positive electrode detection points and the number of second negative electrode detection points is at least M+1. For example, if four partitions are arranged on the substrate 1, then the sum of the number of second positive electrode detection points and the number of second negative electrode detection points is 5, so one second positive electrode detection point and four second negative electrode detection points may be selected to be arranged on the substrate 1, and these four second negative electrode detection points are respectively connected to negative electrodes of four partitions. This design can greatly decrease the number of the second positive electrode detection points or the second negative electrode detection points on the substrate 1, and thus can greatly reduce the manufacturing cost.

In another embodiment of the present disclosure, the first surface of the substrate 1 is coated with an insulating reflective layer, and the reflective layer is provided with a hollowed-out partition for exposing the first positive electrode detection point 2, the first negative electrode detection point 3 and multiple bonding pads of the multiple LED chips 8. Through arrangement of the reflective layer, more than 80% of light can be reflected by the reflective layer, thereby brightness can be effectively homogenized among different partitions of the LED chips 8 on the substrate 1, uneven brightness among partitions or within a partition caused by an inexact division of the multiple LED chips 8 can be avoided. In addition, the reflective layer can effectively reduce an arrangement density of the multiple LED chips 8 on the substrate 1, thereby reducing the manufacturing cost. The hollowed-out partition is set up to expose detection points and multiple bonding pads, so as to facilitate welding and detection of the multiple LED chips 8.

In an embodiment, the reflective layer is a white ink layer 6 with high temperature resistance, and the white ink layer 6 has light reflectance greater than 80%.

In an embodiment of the present disclosure, a first protective layer is disposed on the first positive detection point 2 and the first negative detection point 3; and/or, a second protective layer is disposed on the multiple bonding pads. The first protective layer and the second protective layer are made of a same material, i.e., an organic solderability preservative (OSP) film. The OSP film is an organic film, which may be formed on a surface of a bonding pad or detection point through an OPS process to protect a copper layer of the bonding pad and detection point. The OSP film is also capable of preventing oxidation and contamination at a high temperature. The OSP film has a thickness generally controlled in a range of 0.2 μm to 0.5 μm.

Of course, each of the first protective layer and the second protective layer may also be selected to be a metal plating layer. The metal plating layer may not only protect the copper layer of the bonding pad and detection point, but also ensure that the front surface of the substrate 1 has a higher beam rate. Further, the metal plating layer ensures that the detection point is conductive for detection, i.e. it facilitates welding of the multiple bonding pads and the multiple LED chips 8.

Optionally, each of the first protective layer and the second protective layer is a gold-plated layer or a silver-plated layer. The gold-plated layer and silver-plated layer not only have good conductivity, but also have high light reflectance.

Furthermore, each of the multiple LED chips 8 has a beam angle greater than 120°. The multiple LED chips 8 with a large beam angle may cooperate to realize an ultra-thin LED backlight module with evenly mixed light. In this embodiment, the LED backlight module is a mini LED backlight module.

Optionally, the multiple LED chips 8 have a wavelength span equal to or less than 2.5 nm; and/or the multiple LED chips 8 have a voltage drop span equal to or less than 0.1 V; and/or the multiple LED chips 8 have an optical power span equal to or less than 0.2 mW. The wavelength span refers to a wavelength difference of all LED chips 8 on the substrate 1, the voltage drop span refers to a voltage difference of all the LED chips 8 on the substrate 1, and the optical power span refers to an optical power difference of all the LED chips 8 on the substrate 1.

Further, each of the multiple LED chips 8 have a wavelength range of 448.5 to 450 nm or 450 to 451.5 nm, a voltage range of 2.7 to 2.75 V, and an optical power range of 3.6 to 3.7 mW.

In another embodiment of the present disclosure, the multiple LED chips 8 are packaged on the substrate 1 by a packaging colloid 7. Each LED chip 8 is independently packaged by the packaging colloid 7, so that the LED chip 8 may have a small internal stress, and use reliability of the LED chip 8 is further improved.

Figure 6:
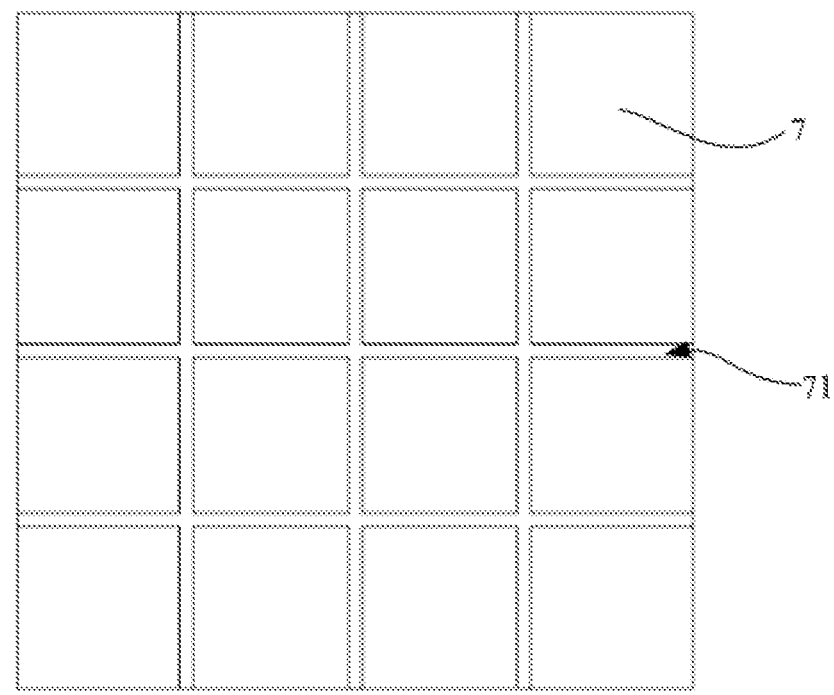
FIG. 6 is a top view of a packaging colloid according to an embodiment of the present disclosure.
Figure 7:
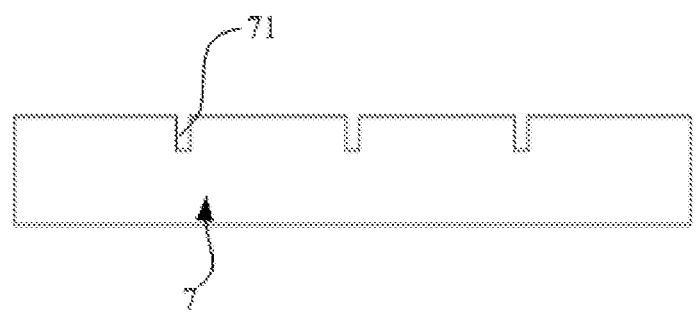
FIG. 7 is a schematic side view of a packaging colloid according to an embodiment of the present disclosure.
Figure 8:
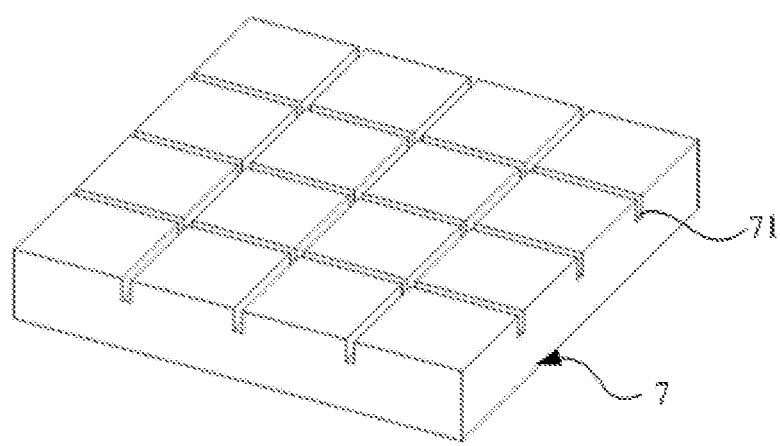
FIG. 8 is a schematic perspective view of a packaging colloid according to an embodiment of the present disclosure.

As shown in FIGS. 6 to 8, in order to reduce a stress effect of the packaging colloid 7 on the LED chips 8, a groove 71 is arranged on the packaging colloid 7, and the groove 71 is unconnected to a cavity of the packaged LED chips 8. In an embodiment, multiple grooves 71 may also be crisscrossed on the entire packaging colloid 7 to enhance elimination of stress.

Optionally, the packaging colloid 7 is a transparent packaging colloid, and the packaging colloid is epoxy resin or a silica colloid, which may reduce light loss.

Alternatively, the packaging colloid 7 is any one of a yellow fluorescent powder colloid, a packaging colloid with high color gamut of R and G colors and mixed with KSF powder or a red and green quantum dot protective film, thereby white light is obtained.

The packaging colloid 7 on the surface of the packaged LED chips 8 has a shape of a rectangular, a hemisphere or an ellipsoidal.

In another embodiment of the present disclosure, referring to FIGS. 1 to 3, the substrate 1 has a second surface opposite to the first surface, the multiple LED chips 8 are arranged on the first surface, a heat dissipation layer 11 is disposed on the second surface. Through arrangement of the heat dissipation layer 11 on the back surface of the substrate 1, heat dissipation of the substrate 1 can be accelerated. Since the LED backlight module has a large number of the multiple LED chips 8, a large amount of heat is generated. In addition, the multiple LED chips 8 are highly sensitive to heat. In light of this, the heat dissipation layer 11 can accelerate the heat dissipation of the LED backlight module and prolong service life of the multiple LED chips 8 of the LED backlight module.

In an embodiment, the heat dissipation layer 11 is a heat dissipation copper layer in a form of mesh spots. The heat dissipation copper layer in the form of mesh spots can accelerate the heat dissipation of the substrate 1, reduce the stress has and has a low manufacturing cost. At the same time, an installation space can be reserved for the second detection group or the first detection group while overall uniform heat dissipation of the substrate 1 is performed.

The embodiments of the present disclosure also provide a display screen, which includes any one LED backlight module according to the above embodiments. The structure and function of the LED backlight module are clearly explained in the above embodiments and will not be repeated here.

In the description of this specification, the description referring to terms "an embodiment", "an example" and the like means that a specific feature, structure, material or characteristic described in connection with the embodiments or examples is included in at least one embodiment or example of the present disclosure. In this specification, schematic representation of the above-mentioned terms is unnecessarily referring to a same embodiment or example. Moreover, specific features, structures, materials, or characteristics described may be combined with any one or more embodiments or examples in a suitable manner.

Technical principles of the present disclosure are described above with reference to specific embodiments. These descriptions are only for purposes of explaining the principles of the present disclosure and should not be construed as a limitation of the protection scope of the present disclosure in any way. Based on the explanation here, those skilled in the art may associate with other specific embodiments of the present disclosure without creative work, which will fall in the protection scope of the present disclosure.

What is claimed is:

1. A LED backlight module, comprising a substrate and a plurality of LED chips arranged on the substrate,
   wherein one of:
      one first detection group is arranged on the substrate for each LED chip of more than one LED chip arranged at an interval of N LED chips connected in series, N is greater than 0; or
      a plurality of first detection groups arranged on the substrate are in one-to-one correspondence with the plurality of LED chips;
   wherein the first detection group comprises a first positive electrode detection point and a first negative electrode detection point, the first positive electrode detection point and the first negative electrode detection point of the first detection group are respectively connected to a positive electrode and a negative electrode of each LED chip; and
   wherein a positive electrode bonding pad, a negative electrode bonding pad, a conductive wire for connecting the positive electrode bonding pad to another negative electrode bonding pad adjacent to the positive electrode bonding pad and a conductive wire for connecting the negative electrode bonding pad to another positive electrode bonding pad adjacent to the negative electrode bonding pad are arranged on the substrate corresponding to each LED chip, wherein the first positive electrode detection point is arranged on a conductive wire connected to the positive electrode bonding pad of each LED chip, and the first negative electrode detection point is connected to a conductive wire connected to the negative electrode bonding pad of each LED chip.

2. The LED backlight module according to claim 1, wherein a plurality of partitions are arranged on the substrate, and each partition of the plurality of partitions is provided with at least two LED chips connected in series or parallel, wherein the LED backlight module further comprises a second detection group configured to independently detect each partition, wherein the second detection group comprises a second positive electrode detection point and a second negative electrode detection point, the second positive electrode detection point and the second negative electrode detection point of the second detection group are respectively connected to a positive electrode and a negative electrode of each partition.

3. The LED backlight module according to claim 2, wherein a number of the plurality of partitions is M, and a sum of a number of second positive electrode detection points and a number of second negative electrode detection points is at least M+1.

4. The LED backlight module according to claim 1, wherein the substrate has a first surface, the plurality of LED chips and the first detection group are arranged on the first surface.

5. The LED backlight module according to claim 1, wherein the substrate has a first surface and a second surface opposite to the first surface, wherein the plurality of LED chips is arranged on the first surface, the first detection group is arranged on the second surface, a through via is formed through the substrate, a conductive element is disposed in the through via, each conductive element is separately connected to one of the first detection group or the each LED chip.

6. The LED backlight module according to claim 1, wherein the substrate has a first surface, the plurality of LED chips is arranged on the first surface, wherein the first surface is coated with an insulating reflective layer, and the insulating reflective layer is provided with a hollowed-out partition for exposing the first positive electrode detection point, the first negative electrode detection point and a plurality of bonding pads of the plurality of LED chips.

7. The LED backlight module according to claim 6, wherein the insulating reflective layer is a white ink layer with high temperature resistance, wherein the white ink layer has light reflectance greater than 80%.

8. The LED backlight module according to claim 6, wherein at least one of:
a first protective layer is disposed on the first positive detection point and the first negative detection point; or
a second protective layer is disposed on the plurality of bonding pads.

9. The LED backlight module according to claim 8, wherein the first protective layer and the second protective layer are made of a same material.

10. The LED backlight module according to claim 8, wherein each of the first protective layer and the second protective layer is an OSP film or a metal plating layer.

11. The LED backlight module according to claim 1, wherein each of the plurality of LED chips has a beam angle greater than 120°.

12. The LED backlight module according to claim 1, wherein at least one of:
the plurality of LED chips has a wavelength span equal to or less than 2.5 nm;
the plurality of LED chips has a voltage drop span equal to or less than 0.1 V; or
the plurality of LED chips has an optical power span equal to or less than 0.2 mW.

13. The LED backlight module according to claim 1, wherein the plurality of LED chips is packaged on the substrate by a packaging colloid.

14. The LED backlight module according to claim 13, wherein a groove is formed on a surface of the packaging colloid, wherein the groove is unconnected to a cavity of the packaging colloid for packaging the plurality of LED chips.

15. The LED backlight module according to claim 13, wherein the packaging colloid is one of a transparent packaging colloid, a YAG fluorescent powder colloid, KSF fluoride fluorescent powder or a quantum dot protective film.

16. The LED backlight module according to claim 1, wherein the substrate has a first surface and a second surface opposite to the first surface, the plurality of LED chips is arranged on the first surface, a heat dissipation layer is disposed on the second surface.

17. The LED backlight module according to claim 16, wherein the heat dissipation layer is a heat dissipation copper layer in a form of mesh spots.

18. A display screen, comprising a LED backlight module,
wherein the LED backlight module comprises a substrate and a plurality of LED chips arranged on the substrate, wherein one of: one first detection group is arranged on the substrate for each LED chip of more than one LED chip arranged at an interval of N LED chips connected in series, N is greater than 0; or a plurality of first detection groups arranged on the substrate are in one-to-one correspondence with the plurality of LED chips; wherein the first detection group comprises a first positive electrode detection point and a first negative electrode detection point, the first positive electrode detection point and the first negative electrode detection point of the first detection group are respectively connected to a positive electrode and a negative electrode of each LED chip; and wherein a positive electrode bonding pad, a negative electrode bonding pad, a conductive wire for connecting the positive electrode bonding pad to another negative electrode bonding pad adjacent to the positive electrode bonding pad and a conductive wire for connecting the negative electrode bonding pad to another positive electrode bonding pad adjacent to the negative electrode bonding pad are arranged on the substrate corresponding to each LED chip, wherein the first positive electrode detection point is arranged on a conductive wire connected to the positive electrode bonding pad of each LED chip, and the first negative electrode detection point is connected to a conductive wire connected to the negative electrode bonding pad of each LED chip.

* * * * *